United States Patent
Saitou et al.

(10) Patent No.: US 7,400,220 B2
(45) Date of Patent: Jul. 15, 2008

(54) SURFACE ACOUSTIC WAVE DEVICE

(75) Inventors: Yasuyuki Saitou, Yokohama (JP);
Osamu Kawachi, Yokohama (JP)

(73) Assignee: Fujitsu Media Devices Limited, Yokohama (JP)

( * ) Notice: Subject to any disclaimer, the term of this patent is extended or adjusted under 35 U.S.C. 154(b) by 0 days.

(21) Appl. No.: 11/065,363

(22) Filed: Feb. 25, 2005

(65) Prior Publication Data

US 2005/0190014 A1 Sep. 1, 2005

(30) Foreign Application Priority Data

Feb. 26, 2004 (JP) .............................. 2004-052502

(51) Int. Cl.
*H03H 9/00* (2006.01)
*H03H 9/25* (2006.01)

(52) U.S. Cl. ..................................... 333/195; 333/133
(58) Field of Classification Search ................. 333/133, 333/193, 194, 195
See application file for complete search history.

(56) References Cited

U.S. PATENT DOCUMENTS

| 5,874,869 | A  | * | 2/1999 | Ueda et al. ................... 333/193 |
| 7,015,776 | B2 | * | 3/2006 | Takamine ................... 333/195 |
| 2003/0169129 | A1 | | 9/2003 | Takamine |
| 2003/0231083 | A1 | | 12/2003 | Detlefsen |

FOREIGN PATENT DOCUMENTS

| EP | 1267489 | 12/2002 |
| EP | 1320192 | 6/2003 |
| JP | 62-199111 A | 9/1987 |
| JP | 6-338756 | 12/1994 |
| JP | 10-215145 | 8/1998 |
| JP | 2001-332954 A | 11/2001 |
| JP | P 2003-188674 A * | 4/2003 |

* cited by examiner

*Primary Examiner*—Dean O Takaoka
(74) *Attorney, Agent, or Firm*—Arent Fox LLP.

(57) ABSTRACT

A surface acoustic wave device includes a surface acoustic wave resonator. The surface acoustic wave resonator includes comb-like electrodes and reflection electrodes provided on both sides of the comb-like electrodes, and each of the reflection electrodes has at least two different pitches. It is thus possible to suppress the ripple components.

7 Claims, 8 Drawing Sheets

SURFACE ACOUSTIC WAVE DEVICE

BACKGROUND OF THE INVENTION

1. Field of the Invention

This invention generally relates to a surface acoustic wave device having a surface acoustic wave resonator, and more particularly, to a configuration of the surface acoustic wave (hereinafter referred to as SAW) device having a pair of reflection electrodes provided on both sides of a pair of comb-like electrodes.

2. Description of the Related Art

In recent years, wireless devices such as mobile telephones have increasingly been downsized, more advanced and more sophisticated. A high frequency circuit of the wireless device includes a filter of the SAW resonator. The filter is a ladder-type filter or a multimode type filter. The ladder-type filter has a structure in which multiple surface acoustic wave filters are connected in a ladder structure. The multimode type filter includes, for example, a double mode SAW (DMS) filter.

FIG. 1 shows a normal single-port SAW resonator described in Japanese Patent Application Publication No. 6-338756 (hereinafter referred to as Document 1) and Japanese Patent Application Publication No. 10-215145 (hereinafter referred to as Document 2). The SAW resonator includes a pair of comb-like electrodes 10 provided on a piezoelectric substrate. The comb-like electrodes 10, which are alternately interleaved on the piezoelectric substrate, are known as inter-digital transducer (IDT). Each of the comb-like electrodes includes a bus bar and electrode fingers that extend from the bus bar in the same direction. A wavelength of the IDT 10 is decided by pitch (period) $\lambda_{IDT}$ between the electrode fingers that extend from the same bus bar. The IDT 10 has a single pitch IDT. A pair of reflection electrodes 12 and 14 are provided on both sides of the IDT 10. The reflection electrodes 12 and 14 shown in FIG. 1 are referred to as a grating-type electrode, and the electrode fingers extending from one bus bar are connected to the other bus bar. Pitches $\lambda a$ and $\lambda b$ of the reflection electrodes 12 and 14 correspond to the periods between the alternate electrode fingers. The reflection electrode 12 has the pitch $\lambda a$ and the reflection electrode 14 has the pitch $\lambda b$. Here, $\lambda a$ is equal to $\lambda b$.

The conventional SAW resonators described in Documents 1 and 2; however, have a problem in that resonance characteristics include a ripple component. FIG. 2 is a graph illustrating the resonance characteristics of the SAW resonator shown in FIG. 1. Referring to FIG. 2, the horizontal axis denotes frequency (MHz), and the vertical axis denotes attenuation (dB). As shown in FIG. 2, the curve showing the resonance characteristics includes multiple peaks, namely, the ripple component. FIG. 3 shows filter characteristics in the case where the filter is composed of the above-mentioned multiple SAW resonators. Referring to FIG. 3, multiple ripple components are included in a passband. In this manner, it is hard to form a flat passband with the conventional filter.

SUMMARY OF THE INVENTION

Present invention has been made in view of the above-mentioned circumstances and provides a SAW device having characteristics in which ripple components are suppressed.

According to an aspect of the present invention, preferably, there is provided a surface acoustic wave device comprising a surface acoustic wave resonator. The surface acoustic wave resonator includes comb-like electrodes and reflection electrodes provided on both sides of the comb-like electrodes, and each of the reflection electrodes has at least two different pitches.

BRIEF DESCRIPTION OF THE DRAWINGS

Preferred embodiments of the present invention will be described in detail with reference to the following drawings, wherein.

DESCRIPTION OF THE PREFERRED EMBODIMENTS

A description will now be given, with reference to the accompanying drawings, of embodiments of the present invention.

Figure 4:
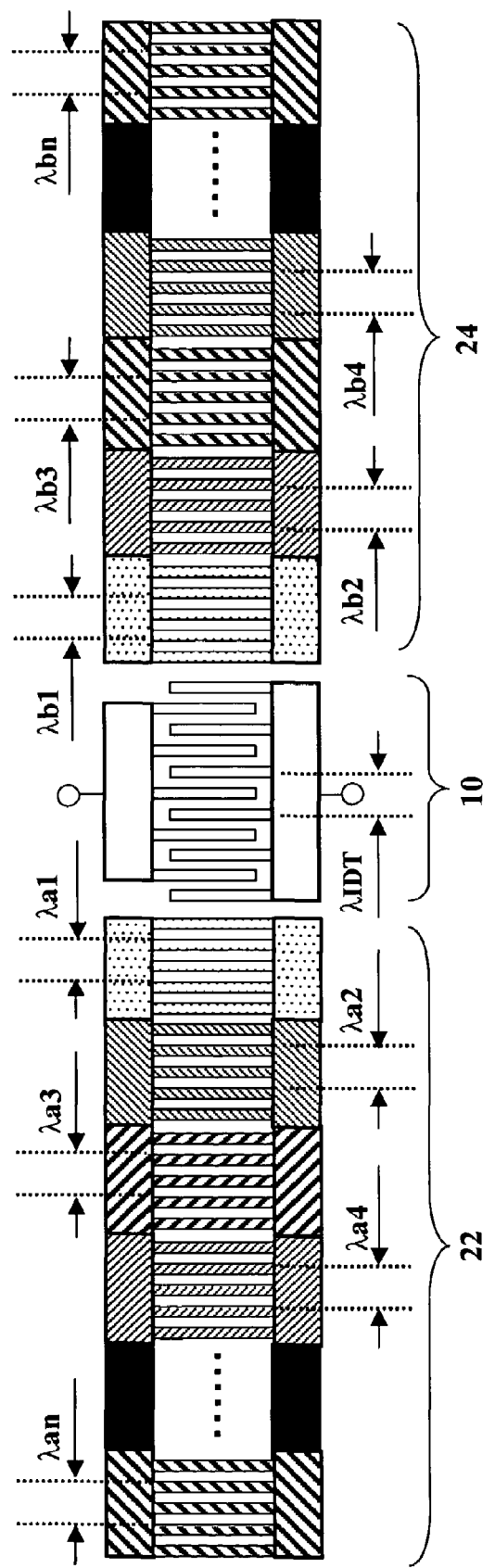
FIG. 4 shows a SAW device (resonator) in accordance with the embodiments of the present invention.

FIG. 4 shows a SAW device in accordance with an embodiment of the present invention. The SAW device includes an IDT 10 and reflection electrodes 22 and 24. The IDT 10 is provided on a piezoelectric substrate of piezoelectric single crystal such as LT ($LiTaO_3$) or LN ($LiNbO_3$). In FIG. 4, the piezoelectric substrate corresponds to a paper. The reflection electrodes 22 and 24 are arranged on both sides of the IDT 10. The SAW device serves as a single-port SAW resonator. The IDT 10 comprises a pair of comb-like electrodes, and applies a drive voltage between two bus bars to excite the surface acoustic waves according to the pitch $\lambda_{IDT}$. The reflection electrodes 22 and 24 provided on the piezoelectric substrate serve as reflectors, and confines the SAW propagated from the IDT 10.

The inventors of the present invention found that it is possible to decrease ripples in the resonance characteristics of the SAW device, by devising the structure of the reflection electrodes.

The reflection electrode 22 has n-number different pitches $\lambda a1, \lambda a2, \lambda a3, \lambda a4 \ldots$, and $\lambda an$ ($\lambda a1 \neq \lambda a2 \neq \lambda a3 \neq \lambda a4 \neq \ldots \neq \lambda an$). n is a natural number of two or more. In other words, the reflection electrode 22 has n-number different wavelengths $\lambda a1, \lambda a2, \lambda a3, \lambda a4 \ldots$, and $\lambda an$ ($\lambda a1 \neq \lambda a2 \neq \lambda a3 \neq$ $\lambda a4 \neq \ldots \neq \lambda an$). n is a natural number of two or more. The reflection electrode 22 includes at least one pair of electrode fingers in each pitch. In order to facilitate the understanding of this configuration, the reflection electrode 22 in FIG. 4 has three pairs of electrode fingers in every pitch. In this manner, the pairs of the electrode fingers in the reflection electrode 22 are divided into n. The electrode 22 has pairs of electrode fingers having respectively different pitches $\lambda a1$, $\lambda a2$, $\lambda a3$, $\lambda a4 \ldots$, and $\lambda an$. As described, the inventors found that the reflection electrode was divided into n having different pitch values and it was possible to reduce the ripple components included in the resonance characteristics. That is to say, the ripples included in the resonance characteristics can be decreased by configuring the reflection electrode 22 to have multiple different reflection wavelengths.

The reflection electrode 24 has the same configuration as that of the reflection electrode 22. That is, the reflection electrode 24 has n-number different pitches $\lambda b1$, $\lambda b2$, $\lambda b3$, $\lambda b4 \ldots$, and $\lambda bn$ ($\lambda b1 \neq \lambda b2 \neq \lambda b3 \neq \lambda b4 \neq \ldots \neq \lambda bn$). n is a natural number of two or more. In other words, the reflection electrode 22 has n-number different wavelengths $\lambda b1$, $\lambda b2$, $\lambda b3$, $\lambda b4 \ldots$, and $\lambda bn$ ($\lambda b1 \neq \lambda b2 \neq \lambda b3 \neq \lambda b4 \neq \ldots \neq \lambda bn$). n is a natural number of two or more. The reflection electrode 24 includes at least one pair of electrode fingers in each pitch. In order to facilitate the understanding of this configuration, the reflection electrode 24 in FIG. 4 has three pairs of electrode fingers in every pitch. In this manner, the pairs of the electrode fingers in the reflection electrode 24 are divided into n. The electrode 24 has pairs of electrode fingers having respectively different pitches $\lambda b1$, $\lambda b2$, $\lambda b3$, $\lambda b4 \ldots$, and $\lambda bn$.

Figure 2:
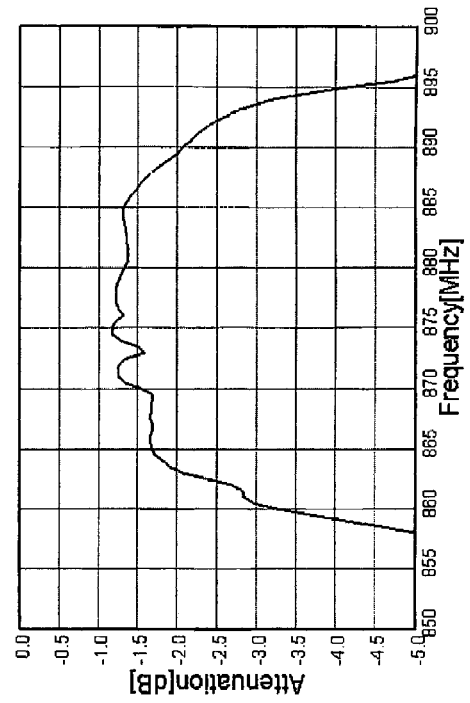
FIG. 2 is a graph describing resonance characteristics of the SAW resonator shown in FIG. 1.
Figure 3:
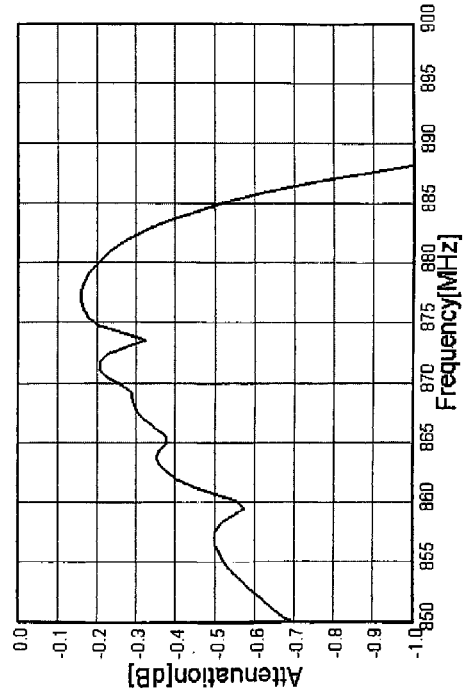
FIG. 3 is a graph describing filter characteristics of a filter having multiple SAW resonators shown in FIG. 1.
Figure 5:
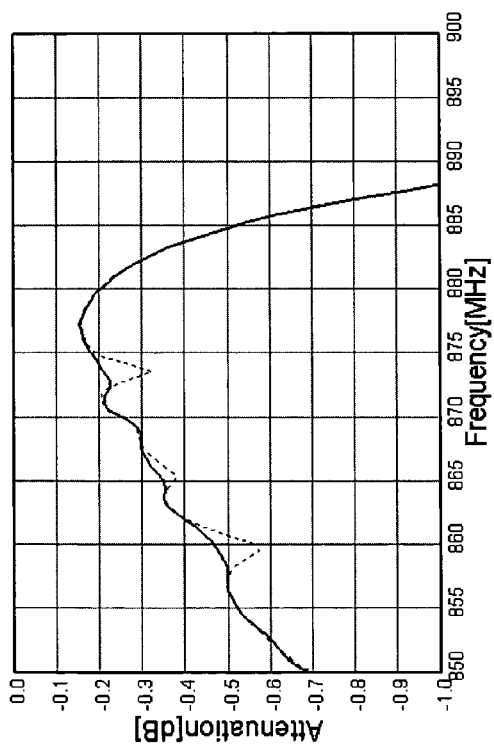
FIG. 5 is a graph describing the resonance characteristics of a filter having multiple SAW resonators shown in FIG. 4.

FIG. 5 shows the resonance characteristics of the SAW device shown in FIG. 5. The solid line in FIG. 4 denotes the resonance characteristics of the SAW device. For comparison, the dotted line denotes the resonance characteristics of the conventional SAW device shown in FIG. 2. In the case where the reflection electrodes 22 and 24 respectively have two different pitches, the ripple components of the resonance characteristics can be suppressed.

Figure 1:
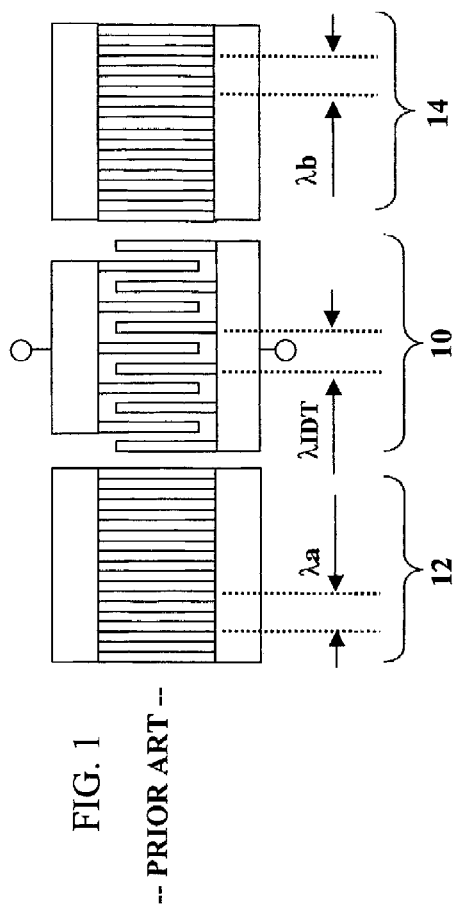
FIG. 1 shows a conventional SAW resonator.
Figure 6:
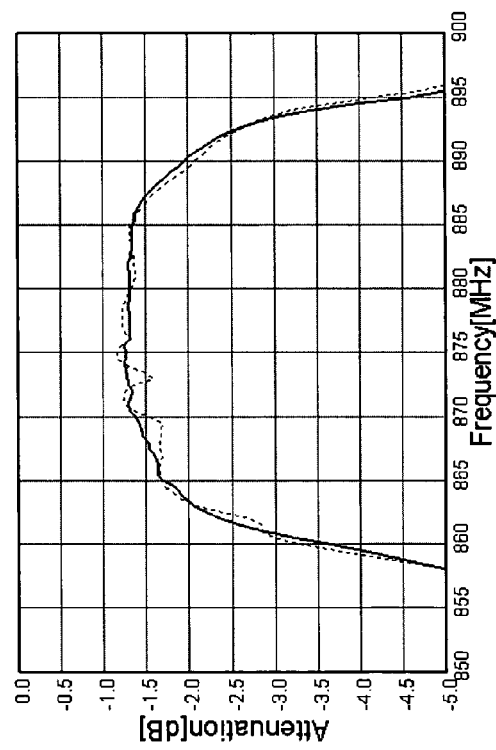
FIG. 6 is a graph describing filter characteristics of the filter having multiple SAW devices shown in FIG. 4.

FIG. 6 shows the filter characteristics of the SAW device in which the multiple SAW resonators are connected in a ladder structure. Referring to FIG. 6, in the case where the SAW resonators are connected in the ladder structure, the bandpass filter characteristics are obtainable. The solid line in FIG. 6 denotes the filter characteristics of the SAW resonators shown in FIG. 4. The dotted line in FIG. 6 denotes the filter characteristics of the SAW resonators shown in FIG. 1, which are connected in the ladder structure.

Preferably, the division number n of the reflection electrodes 22 and 24 is equal. However, the effects of suppressing the ripples have been confirmed, even if the division number is not equal. In addition, corresponding portions of the electrodes 22 and 24 may have the same pitch or may have different pitches. For example, $\lambda a1$ and $\lambda b1$ closest to the IDT 10 may be equal ($\lambda a1 = \lambda b1$) or may be different ($\lambda a1 \neq \lambda b1$). Further, the electrode fingers having the same pitch may be arranged in different places. In an extreme case, $\lambda a1$ may be equal to $\lambda bn$, namely, $\lambda a1 = \lambda bn$. Also, part of the multiple pitches of the reflection electrode 22 may be different from those of the reflection electrode 24. The number of pairs of the electrode fingers having the same pitches may be different in the reflection electrodes 22 and 24.

First Embodiment

Figure 7:
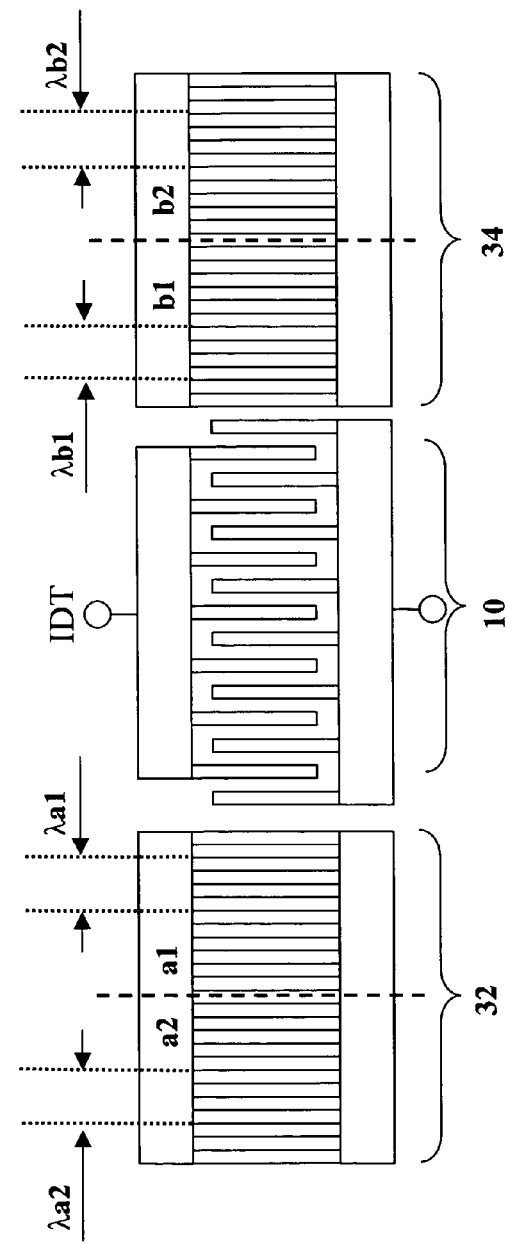
FIG. 7 shows a SAW device in accordance with a first embodiment of the present invention.

FIG. 7 shows a SAW device in accordance with a first embodiment of the present invention. The SAW device includes the IDT 10 and a pair of reflection electrodes 32 and 34. The IDT 10 is provided on a piezoelectric substrate of 42° Y-cut X-propagation LitaO$_3$. The pair of the reflection electrodes 32 and 34 are arranged on both sides of the IDT 10. An electrode pattern arranged on the piezoelectric substrate is made of, for example, a conductive material having aluminum as a main component. The reflection electrode 32 is divided into two division parts, a1 and a2. One division part a1 includes pairs of the electrode fingers arranged in the pitch of $\lambda a1$. The other part a2 includes pairs of the electrode fingers arranged in the pitch of $\lambda a2$. Here, $\lambda a1$ is not equal to $\lambda a2$. That is, the reflection electrode 32 corresponds to the case where n is equal to 2 in FIG. 4. In the same manner, the reflection electrode 34 is divided into two division parts, b1 and b2. One division part b1 includes pairs of the electrode fingers arranged in the pitch of $\lambda b1$. The other part b2 includes pairs of the electrode fingers arranged in the pitch of $\lambda b2$. Here, $\lambda b1$ is not equal to $\lambda b2$. That is, the reflection electrode 34 corresponds to the case where n is equal to 2 in FIG. 4. The pitch (wavelength) of the reflection electrode 32 and the pitch (wavelength) of the reflection electrode 34 have a relationship that $\lambda a1$ is equal to $\lambda b1$ and $\lambda a2$ is equal to $\lambda b2$. Additionally, a reflected wave reflected by the division part a1 is configured to have a reverse phase of that reflected by the division part a2. In the same manner, the reflected wave reflected by the division part b1 is configured to have the reverse phase of that reflected by the division part b2.

Table 1 shows an example of the pitches $\lambda a1$, $\lambda a2$, $\lambda b1$, and $\lambda b2$. For comparison, a comparative example of the conventional technique is also shown. The conventional technique has the reflection electrodes of a single pitch in the resonator.

TABLE 1

|  | $\lambda a2$ [μm] | $\lambda a1$ [μm] | $\lambda b1$ [μm] | $\lambda b2$ [μm] |
|---|---|---|---|---|
| First embodiment | 4.396 | 4.411 | 4.411 | 4.396 |
| Comparative example | 4.396 | | | 4.396 |

Figure 8:
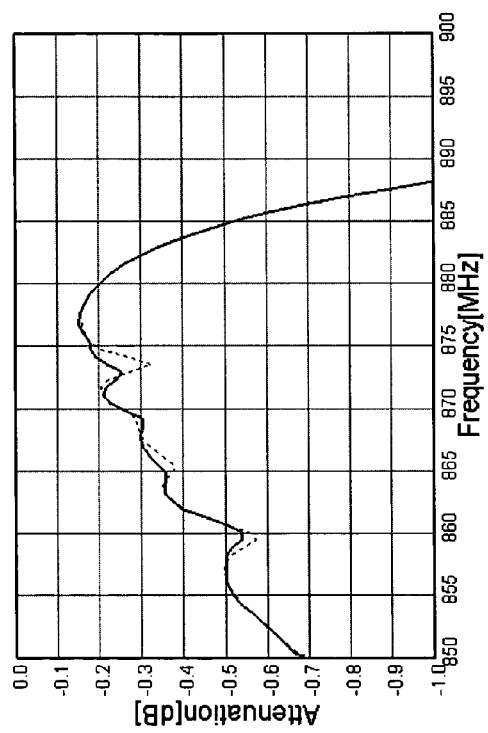
FIG. 8 is a graph describing the resonance characteristics in accordance with the first embodiment of the present invention.

FIG. 8 is a graph describing the resonance characteristics in accordance with the first embodiment of the present invention. The solid line denotes the resonance characteristics of the first embodiment of the present invention, and the dotted line denotes the resonance characteristics of the comparative example. It is possible to reduce the ripples drastically by setting the relationship of the reflection electrodes 32 and 34 so that $\lambda a1$ is not equal to $\lambda a2$ and $\lambda b1$ is not equal to $\lambda b2$. In particular, the improved ripple effects are caused resulting from a reversed phase relationship of reflected waves between $\lambda a1$ and $\lambda a2$ and between $\lambda b1$ and $\lambda b2$. It is possible to reduce the ripples by configuring so that $\lambda a1$ is not equal to $\lambda a2$ and $\lambda b1$ is not equal to $\lambda b2$, even if the above-mentioned reversed phase relationship is not established.

The resonance characteristics same as those in FIG. 8 are obtainable in the case where $\lambda a1$ is not equal to $\lambda a2$, $\lambda b1$ is not equal to $\lambda b2$, $\lambda a1$ is not equal to $\lambda b1$, and $\lambda a2$ is not equal to $\lambda b2$.

Second Embodiment

Figure 9:
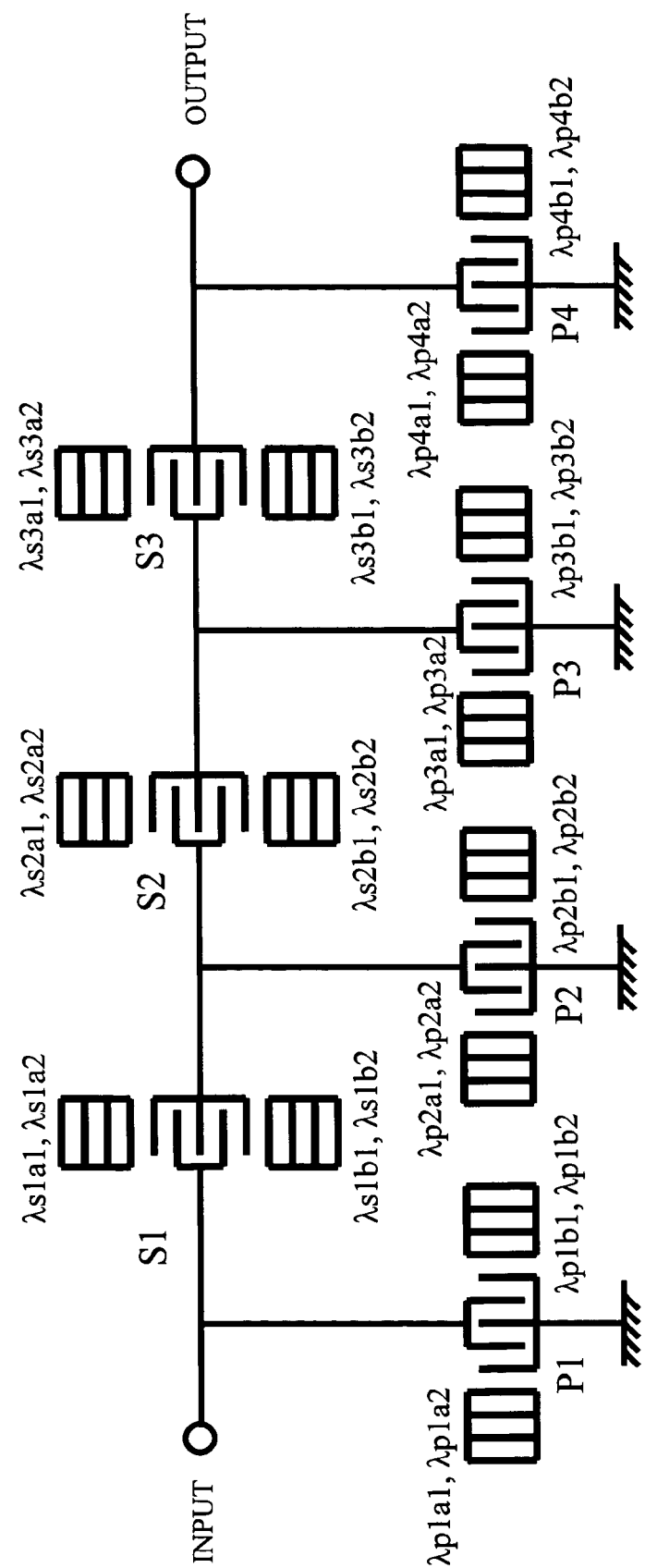
FIG. 9 shows a SAW device in accordance with a second embodiment of the present invention.

FIG. 9 is a SAW device in accordance with a second embodiment of the present invention. The SAW device is the ladder-type filter. This filter includes three series-arm resonators S1, S2, and S3 and four parallel-arm resonators P1, P2, P3, and P4. The above-mentioned resonators are connected in the ladder structure. The resonators S1 through S3 and P1 through P4 respectively include the SAW resonators shown in FIG. 7. The following relationships are established between the series-arm resonators S1 through S3, in the case where the pitches (wavelengths) of the reflection electrodes of the resonators S1 through S3 and P1 through P4 are defined as shown in FIG. 9.

$\lambda sia1 \neq \lambda sia2$
$\lambda sib1 \neq \lambda sib2$
$\lambda sia1 = \lambda sib1$
$\lambda sia2 = \lambda sib2$ Here, i is 1 through 3.

Additionally, the following relationships are established between the parallel-arm resonators P1 through P4.

$\lambda pia1 \neq \lambda pia2$
$\lambda pib1 \neq \lambda pib2$
$\lambda pia1 = \lambda pib1$
$\lambda pia2 = \lambda pib2$ Here, i is 1 through 4.

Further, the reflected waves of $\lambda sia1$ and $\lambda sia2$ are configured to have the reversed phase and the reflected waves of $\lambda pia1$ and $\lambda pia2$ are configured to have the reversed phase. Table 2 shows an example of wavelengths of the resonators. A comparative example of the conventional technique is also shown. The conventional technique includes the resonators S1 through S3 and P1 through P4 having the reflection electrodes of a single pitch. In Table 2, "si" and "pi" are omitted.

| | $\lambda a2[\mu m]$ | $\lambda a1[\mu m]$ | $\lambda b1[\mu m]$ | $\lambda b2[\mu m]$ |
|---|---|---|---|---|
| Second embodiment S1 | 4.396 | 4.381 | 4.381 | 4.396 |
| Second embodiment S2 | 4.386 | 4.401 | 4.401 | 4.386 |
| Second embodiment S3 | 4.396 | 4.411 | 4.411 | 4.396 |
| Second embodiment P1 | 4.562 | 4.547 | 4.547 | 4.562 |
| Second embodiment P2 | 4.583 | 4.573 | 4.573 | 4.583 |
| Second embodiment P3 | 4.583 | 4.568 | 4.568 | 4.583 |
| Second embodiment P4 | 4.562 | 4.552 | 4.552 | 4.562 |
| Comparative example S1 | | 4.396 | 4.396 | |
| Comparative example S2 | | 4.386 | 4.386 | |
| Comparative example S3 | | 4.396 | 4.396 | |
| Comparative example P1 | | 4.562 | 4.562 | |
| Comparative example P2 | | 4.583 | 4.583 | |
| Comparative example P3 | | 4.583 | 4.583 | |
| Comparative example P4 | | 4.562 | 4.562 | |

Figure 10:
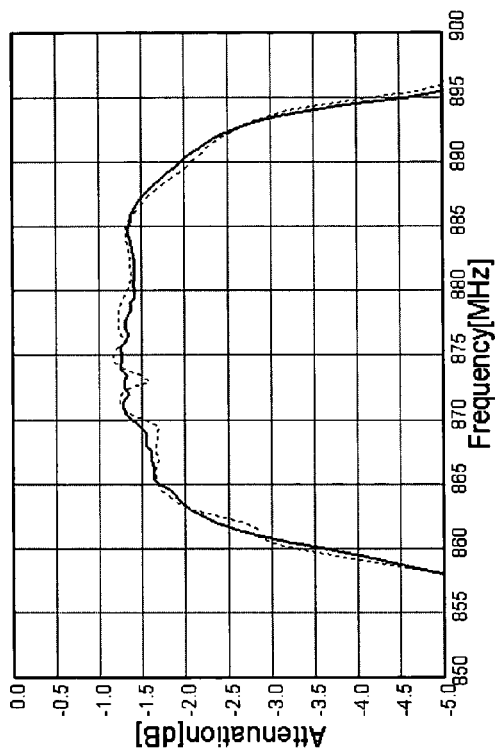
FIG. 10 is a graph describing the resonance characteristics in accordance with a second embodiment of the present invention.

FIG. 10 is a graph showing the filter characteristics of the second embodiment of the present invention. The solid line denotes the filter characteristics of the second embodiment of the present invention, and the dotted line denotes the filter characteristics of the comparative example. It is thus possible to reduce the ripples drastically, by configuring the reflection electrodes of the SAW resonators as mentioned above.

Third Embodiment

Figure 11:
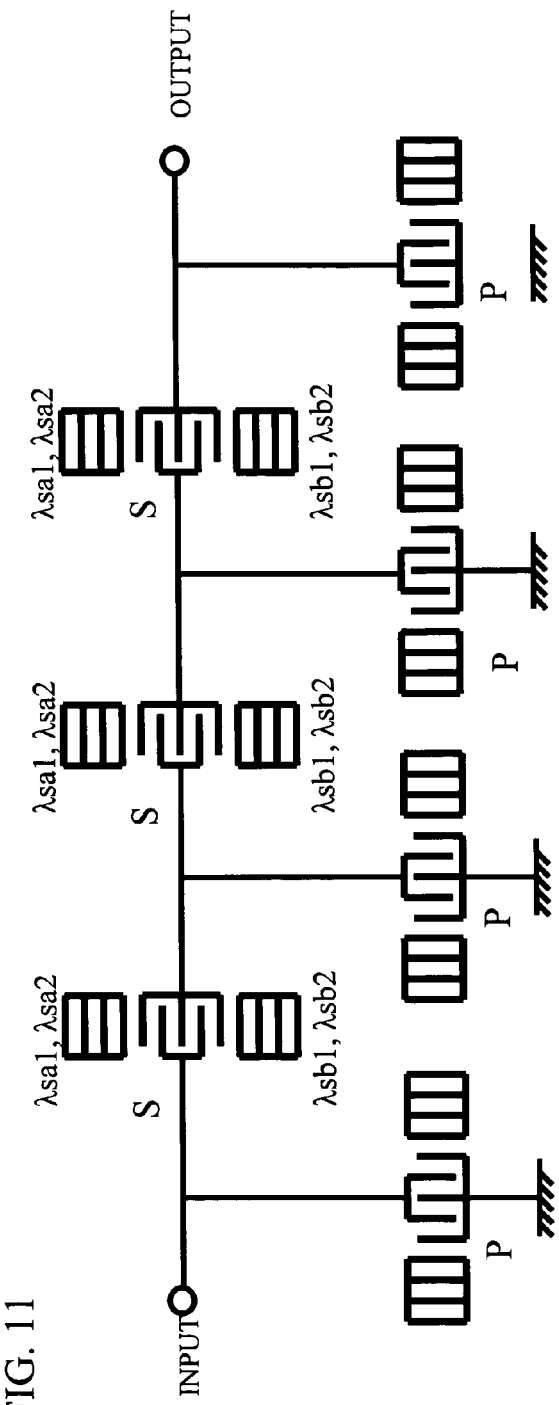
FIG. 11 shows a SAW device in accordance with a third embodiment of the present invention.

FIG. 11 shows a SAW device in accordance with a third embodiment of the present invention. The SAW device is the ladder-type filter and a variation of the second embodiment of the present invention. The ladder-type filter shown in FIG. 11 includes three series-arm resonators and four parallel-arm resonators. In accordance with the third embodiment of the present invention, the three series-arm resonators are composed of SAW resonators S shown in FIG. 4, which have the same specification. The four parallel-arm resonators are composed of SAW resonators P shown in FIG. 1. That is, only the series-arm resonators have the reflection electrodes, each of which has at least two different pitches. In this configuration, it is possible to reduce the ripples drastically as in the filter characteristics defined by the solid line in FIG. 10. The ripples in the filter characteristics are mainly caused by the series-arm resonators.

Fourth Embodiment

Figure 12:
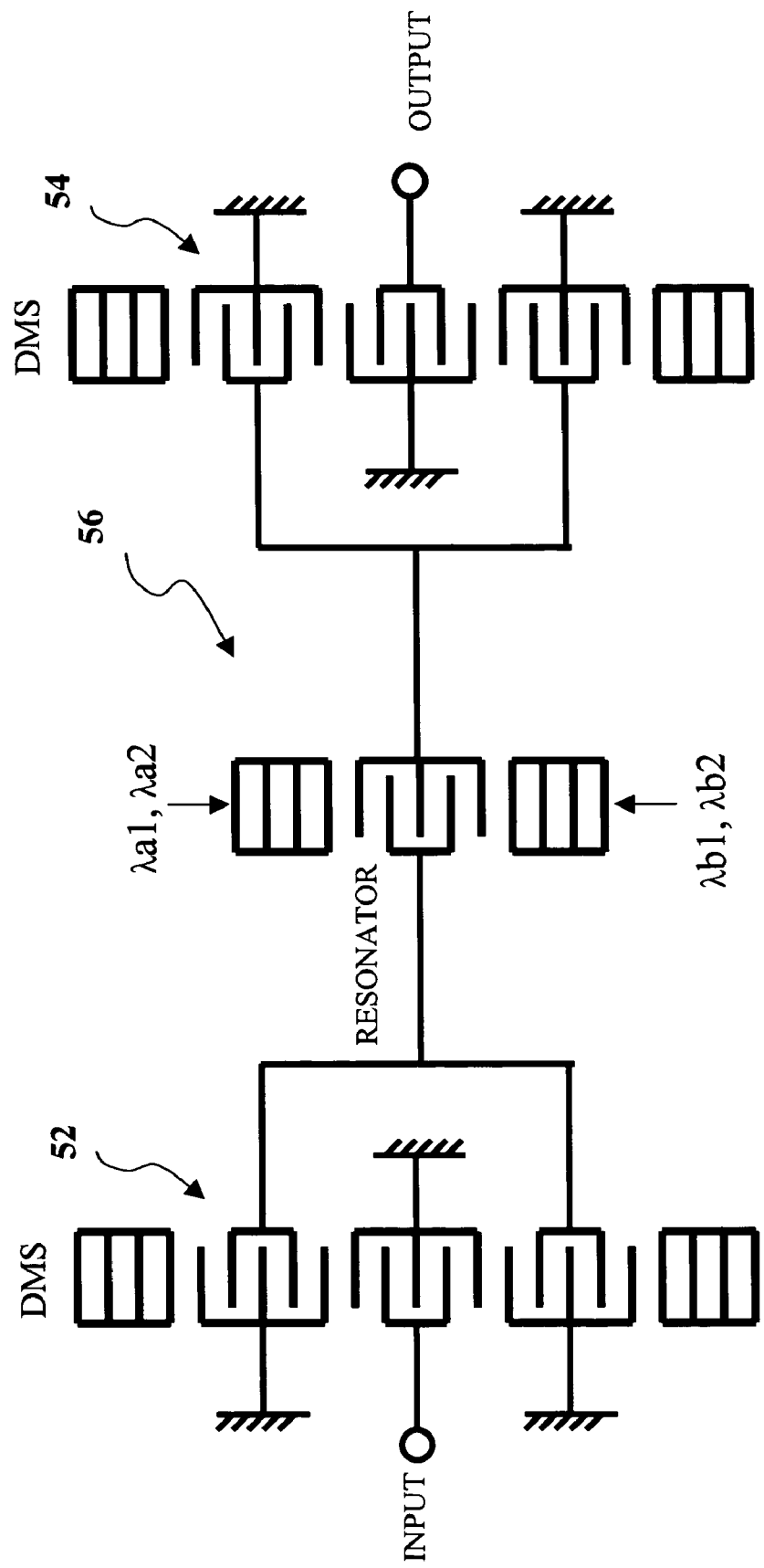
FIG. 12 shows a SAW device in accordance with a fourth embodiment of the present invention.

FIG. 12 is a SAW device in accordance with a fourth embodiment of the present invention. The SAW device includes two DMS (Double Mode SAW) filters 52 and 54 and a single-port SAW resonator 56. The single-port SAW resonator 56 connects the DMS filters 52 and 54. The above-mentioned SAW resonators are arranged on the piezoelectric substrate as in the above-mentioned embodiments of the present invention. The DMS filters 52 and 54 respectively include three SAW resonators arranged in a line and a pair of reflection electrodes arranged on both sides of the DMS filters. The DMS filter 52 is arranged on an inputs side, and the DMS filter 54 is arranged on an output side. The DMS filters 52 and 54 respectively have bandpass characteristics.

The single-port SAW resonator 56 is provided together with the DMS filters 52 and 54 so as to obtain desirable filter characteristics. The SAW resonator 56 is configured as shown in FIG. 4. That is, each of the reflection electrodes of the SAW resonator 56 has at least two different pitches. With this configuration, it is possible to reduce the ripple components included in the passband.

Table 3 shows an example of the pitches $\lambda a1$, $\lambda a2$, $\lambda b1$, and $\lambda b2$ of the SAW resonator 56. A comparative example of the conventional technique is also shown. The conventional technique includes the resonators, each of which has the reflection electrode of a single pitch.

TABLE 3

| | $\lambda a2[\mu m]$ | $\lambda a1[\mu m]$ | $\lambda b1[\mu m]$ | $\lambda b2[\mu m]$ |
|---|---|---|---|---|
| Third embodiment | 2.113 | 2.115 | 2.115 | 2.113 |
| Comparative example | | 2.113 | 2.113 | |

Figure 13:
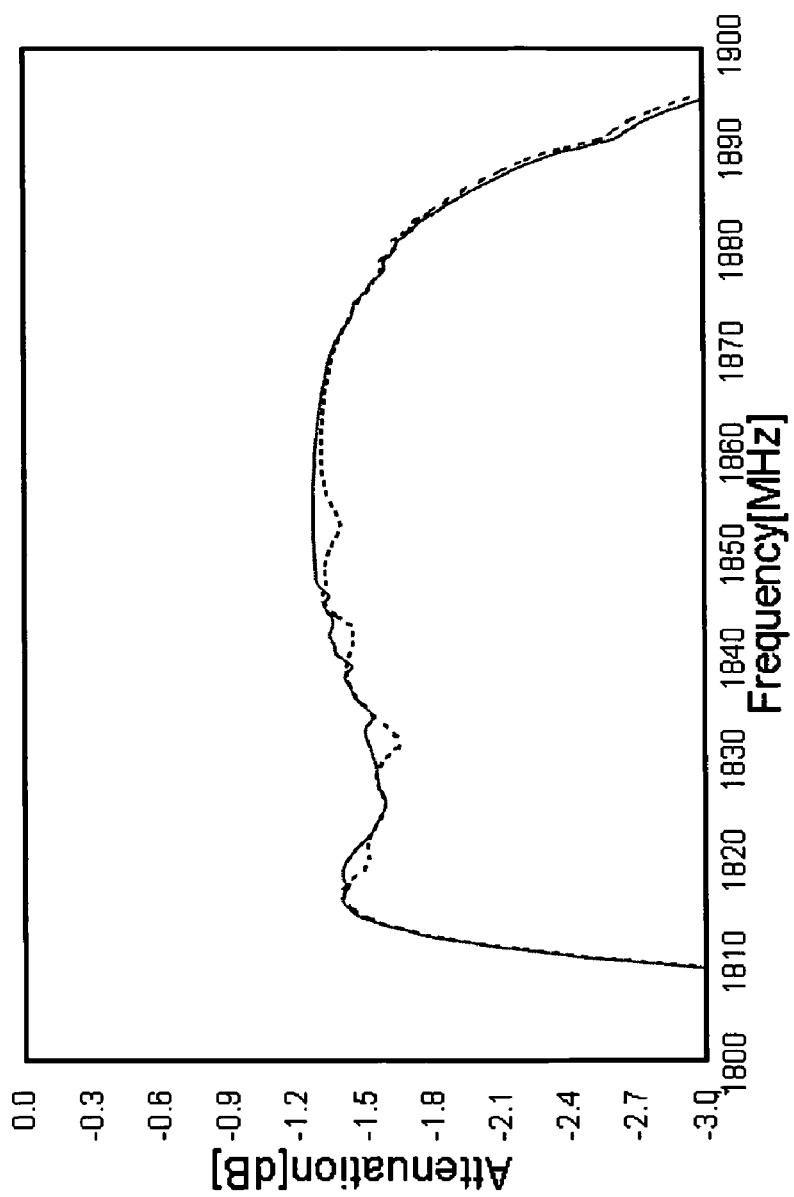
FIG. 13 is a graph describing the filter characteristics in accordance with the fourth embodiment of the present invention.

FIG. 13 is a graph showing the filter characteristics of the fourth embodiment of the present invention. The solid line denotes the filter characteristics of the fourth embodiment of the present invention, and the dotted line denotes the filter characteristics of the comparative example. It is thus possible to reduce the ripple drastically, by configuring each reflection electrode of the SAW resonator 56 so that $\lambda a1$ is not equal to $\lambda a2$ and $\lambda b1$ is not equal to $\lambda b2$.

The present invention is not limited to the above-mentioned embodiments, and other embodiments, variations and modifications may be made without departing from the scope of the present invention.

The present invention is based on Japanese Patent Application No. 2004-052502 filed on Feb. 26, 2004, the entire disclosure of which is hereby incorporated by reference.

What is claimed is:

1. A surface acoustic wave device comprising a surface acoustic wave resonator, wherein:
the surface acoustic wave resonator consists of a single pair of comb-like electrodes and reflection electrodes provided on both sides of the single pair of comb-like electrodes; and
each of the reflection electrodes has at least two different pitches,
wherein reflected waves corresponding to said at least two different pitches have reversed phases.

2. The surface acoustic wave device as claimed in claim 1, wherein the different pitches of one of the reflection electrodes are the same as those of the other.

3. The surface acoustic wave device as claimed in claim 1, wherein the different pitches of one of the reflection electrodes are different from those of the other.

4. The surface acoustic wave device as claimed in claim 1, further comprising another surface acoustic wave resonator having a structure identical to that of the surface acoustic wave resonator.

5. The surface acoustic wave device as claimed in claim 1, further comprising multiple surface acoustic wave resonators each having an identical structure as that of the surface acoustic wave resonator, wherein the surface acoustic wave device and the multiple surface acoustic resonators form a ladder structure.

6. The surface acoustic wave device as claimed in claim 1, further comprising another surface acoustic wave resonator having an identical structure as that of the surface acoustic wave device, wherein the surface acoustic wave resonator and the another surface acoustic wave resonator are series-arm resonators in a ladder structure.

7. The surface acoustic wave device as claimed in claim 1, further comprising multimode SAW filters that are connected through the surface acoustic wave resonator.

* * * * *